United States Patent
Park et al.

(10) Patent No.: US 12,052,833 B2
(45) Date of Patent: Jul. 30, 2024

(54) ELECTRONIC DEVICE AND METHOD OF MANUFACTURING THE SAME

(71) Applicant: Samsung Display Co., Ltd., Yongin-si (KR)

(72) Inventors: Sungjune Park, Seoul (KR); Yonggi Ko, Asan-si (KR); Jinkyu Kim, Cheongju-si (KR); Sungchul Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 61 days.

(21) Appl. No.: 15/923,392

(22) Filed: Mar. 16, 2018

(65) Prior Publication Data
US 2018/0352664 A1 Dec. 6, 2018

(30) Foreign Application Priority Data
Jun. 5, 2017 (KR) .................... 10-2017-0069829

(51) Int. Cl.
- B32B 5/18 (2006.01)
- B32B 7/12 (2006.01)
- B32B 27/06 (2006.01)
- B32B 27/16 (2006.01)
- B32B 27/28 (2006.01)

(Continued)

(52) U.S. Cl.
CPC ............. *H05K 5/0017* (2013.01); *B32B 5/18* (2013.01); *B32B 7/12* (2013.01); *B32B 27/065* (2013.01); *B32B 27/16* (2013.01); *B32B 27/281* (2013.01); *B32B 27/36* (2013.01); *H05K 5/0217* (2013.01); *H05K 5/03* (2013.01); *H05K 9/0058* (2013.01);

(Continued)

(58) Field of Classification Search
CPC .... B32B 2457/20; G09F 9/301; G06F 1/1652
See application file for complete search history.

(56) References Cited

U.S. PATENT DOCUMENTS 9,136,487 B2 9/2015 Nam et al.
9,287,329 B1 * 3/2016 Lee .................... H01L 51/0097
(Continued)

FOREIGN PATENT DOCUMENTS

CN 101479097 A 7/2009
CN 103887315 A 6/2014
(Continued)

OTHER PUBLICATIONS

Baur et al. Plastics Handbook The Resource for Plastics Engineers 5th edition, table 7.9 (Year: 2019).*
(Continued)

*Primary Examiner* — Alicia J Weydemeyer
(74) *Attorney, Agent, or Firm* — Lewis Roca Rothgerber Christie LLP

(57) ABSTRACT

An electronic device includes an electronic panel configured to be folded along a folding axis extending in one direction, a flexible window member on a top surface of the electronic panel, a protective member on a bottom surface of the electronic panel, the protective member including a base layer including a material that has a glass transition temperature higher than a glass transition temperature of polyethylene terephthalate (PET), and a cushion layer contacting a bottom surface of the base layer and having a porous structure, and an adhesive member coupling the electronic panel to the protective member.

16 Claims, 13 Drawing Sheets

(51) Int. Cl.
*B32B 27/36* (2006.01)
*H05K 5/00* (2006.01)
*H05K 5/02* (2006.01)
*H05K 5/03* (2006.01)
*H05K 9/00* (2006.01)

(52) U.S. Cl.
CPC ..... *B32B 2307/728* (2013.01); *B32B 2457/20* (2013.01)

(56) References Cited

U.S. PATENT DOCUMENTS

| | | | |
|---|---|---|---|
| 9,743,518 B2 | 8/2017 | Eom et al. | |
| 10,328,619 B2 | 6/2019 | Lee et al. | |
| 2006/0207967 A1* | 9/2006 | Bocko | B32B 7/06 216/24 |
| 2007/0091074 A1* | 4/2007 | Nashiki | B32B 3/085 345/173 |
| 2007/0189039 A1* | 8/2007 | Yokota | G02B 6/0036 362/619 |
| 2007/0210821 A1* | 9/2007 | Park | H01J 11/44 359/601 |
| 2010/0002402 A1* | 1/2010 | Rogers | H01L 21/4867 361/749 |
| 2010/0226016 A1* | 9/2010 | Hirauchi | G03B 9/02 264/293 |
| 2011/0244652 A1* | 10/2011 | Yamazaki | H01L 21/02046 438/458 |
| 2014/0065326 A1* | 3/2014 | Lee | G09F 9/301 428/12 |
| 2014/0065389 A1* | 3/2014 | Loy | H01L 21/2007 428/214 |
| 2014/0291633 A1 | 10/2014 | Baek et al. | |
| 2015/0044401 A1* | 2/2015 | Teng | B32B 7/12 428/34.5 |
| 2015/0219290 A1* | 8/2015 | Hikmet | F21K 9/64 362/343 |
| 2015/0314561 A1 | 11/2015 | Kim et al. | |
| 2015/0363030 A1 | 12/2015 | Nam et al. | |
| 2016/0190522 A1 | 6/2016 | Lee et al. | |
| 2017/0062742 A1 | 3/2017 | Kim | |

FOREIGN PATENT DOCUMENTS

| | | |
|---|---|---|
| CN | 105867546 A | 8/2016 |
| CN | 105894968 A | 8/2016 |
| CN | 105975135 A | 9/2016 |
| CN | 106023825 A | 10/2016 |
| CN | 106206661 A | 12/2016 |
| JP | 2011228680 A | 11/2011 |
| KR | 1020090015091 A | 2/2009 |
| KR | 1020100123755 A | 11/2010 |
| KR | 10-2013-0008736 A | 1/2013 |
| KR | 1020140033546 A | 3/2014 |
| KR | 10-2014-0118003 A | 10/2014 |
| KR | 10-2015-0144913 A | 12/2015 |

OTHER PUBLICATIONS

Selke et al. Plastics Packaging, Properties, Processing, Applications, And Regulations 3rd edition, table 4.14 (Year: 2016).*
Demirel et al. (BAÜ Fen Bil. Enst. Dergisi Cilt 13(1) 26-35 (2011) ).*
EPO Extended Search Repot dated Oct. 1, 2018, for corresponding European Patent Application No. 18172774.4 (6 pages).

* cited by examiner

ELECTRONIC DEVICE AND METHOD OF MANUFACTURING THE SAME

CROSS-REFERENCE TO RELATED APPLICATION

This application claims priority to, and the benefit of, Korean Patent Application No. 10-2017-0069829, filed on Jun. 5, 2017, the content of which in its entirety is herein incorporated by reference.

BACKGROUND

1. Field

Embodiments disclosed herein relate to an electronic device with improved reliability against folding stress, and a method of manufacturing the same.

2. Description of the Related Art

An electronic device is activated by an applied electrical signal. The electronic device may be realized in various forms in accordance with the needs of users. For example, the electronic device may be a display device that displays an image to provide information to a user. Alternatively, the electronic device may be an input device that senses input of a user or various external inputs to process information corresponding thereto.

The electronic device may include various internal electronic elements for driving, and may include various layers on which the electronic elements are located and/or which protect the electronic elements. Recently, flexible, light, portable electronic devices have been developed, and shapes of electronic devices have been variously modified. Thus, various forms of external impacts may be applied to electronic devices.

SUMMARY

Embodiments described below may provide an electronic device capable of stably responding to an external impact occurring in the environment of use or a process, and of improving reliability.

In an aspect, an electronic device includes an electronic panel configured to be folded along a folding axis extending in one direction, a flexible window member on a top surface of the electronic panel, a protective member on a bottom surface of the electronic panel, the protective member including a base layer including a material that has a glass transition temperature higher than a glass transition temperature of polyethylene terephthalate (PET), and a cushion layer contacting a bottom surface of the base layer and having a porous structure, and an adhesive member coupling the electronic panel to the protective member.

The base layer may include polyimide (PI), polyethylene naphthalate (PEN), or crystalline polyethylene terephthalate (C-PET).

A roughness of the bottom surface of the base layer may be greater than a roughness of a top surface of the base layer.

The bottom surface of the base layer may be more hydrophilic than a top surface of the base layer.

The adhesive member may contact a top surface of the base layer.

The adhesive member may include a pressure sensitive adhesive (PSA).

The cushion layer may include synthetic resin foam.

The protective member may further include a light-shielding layer contacting a top surface of the base layer, and the adhesive member may contact a top surface of the light-shielding layer.

The electronic panel may include an insulating substrate, and a driving element on the insulating substrate, configured to be activated by an external electrical signal applied thereto, and including at least one of a display element for displaying an image and a sensing element for sensing an external input applied to the electronic panel.

The adhesive member may contact a bottom surface of the insulating substrate.

The electronic device may further include a lower protective member between the insulating substrate and the adhesive member and including a polymer material, and an additional adhesive member contacting a bottom surface of the insulating substrate and a top surface of the lower protective member to couple the insulating substrate to the lower protective member, wherein the adhesive member contacts a bottom surface of the lower protective member.

The electronic panel, the window member, the adhesive member, and the protective member may be foldable along the folding axis.

The electronic device may be operable in a first mode in which the electronic device is folded such that the window member is closer to the folding axis than the protective member, and the electronic device may be operable in a second mode in which the electronic device is folded such that the protective member is closer to the folding axis than the window member.

In another aspect, an electronic device includes an electronic panel, a window member on a top surface of the electronic panel, a protective member on a bottom surface of the electronic panel, the protective member including a base layer, and a cushion layer contacting a bottom surface of the base layer and having a porous structure, and an adhesive member contacting a top surface of the base layer and coupling the electronic panel to the protective member.

The base layer may include a material that has a glass transition temperature that is higher than a glass transition temperature of polyethylene terephthalate (PET).

The cushion layer may include synthetic resin foam.

The cushion layer may include one surface contacting the base layer, and another, non-flat surface opposite to the one surface.

A roughness of the bottom surface of the base layer may be greater than a roughness of the top surface of the base layer.

The bottom surface of the base layer may be more hydrophilic than the top surface of the base layer.

The adhesive member may be in contact with the electronic panel, and the adhesive member may include at least one of a pressure sensitive adhesive (PSR), an optical clear adhesive (OCA), or an optical clear resin (OCR).

In still another aspect, a method of manufacturing an electronic device includes surface-treating one surface of a base layer, forming a cushion layer directly on the surface-treated surface, disposing an adhesive member on another surface of the base layer, and attaching the adhesive member to a surface of an electronic panel.

The forming of the cushion layer may include performing a foaming process.

The surface-treating one surface of the base layer may include performing a plasma treatment or a corona treatment.

The surface-treating one surface of the base layer may include roughening the one surface of the base layer.

The surface-treating one surface of the base layer may include hydrophilizing the one surface of the base layer.

The method may further include forming a light-shielding layer on the other surface of the base layer, wherein the adhesive member is on the light-shielding layer.

The forming of the light-shielding layer may include performing a printing process or a deposition process.

BRIEF DESCRIPTION OF THE DRAWINGS

The above and other aspects of the present invention will become more apparent by describing in further detail embodiments thereof with reference to the accompanying drawings, in which.

DETAILED DESCRIPTION

Figure 1A:
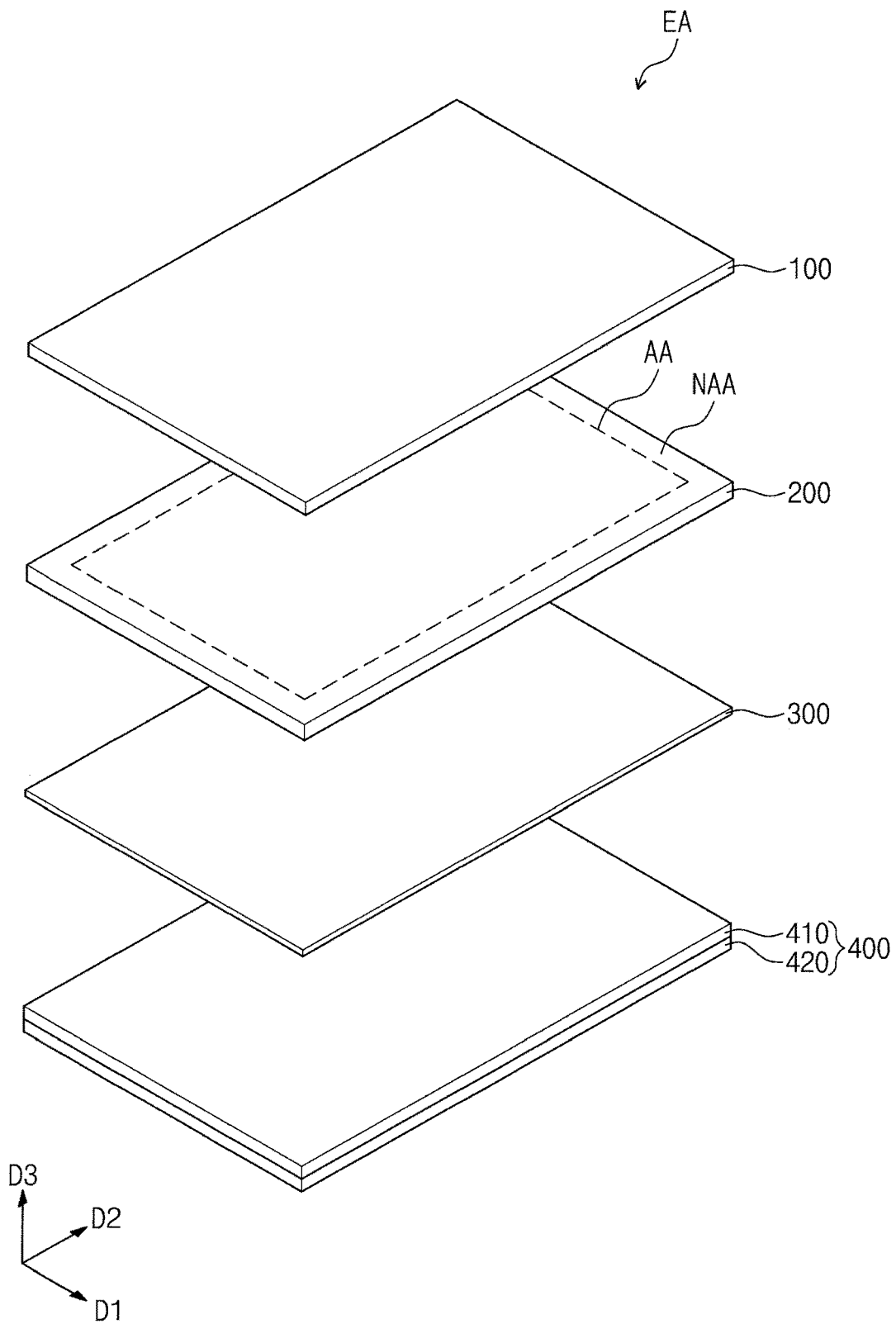
FIG. 1A is an exploded perspective view illustrating an electronic device according to an embodiment of the invention.

Features of the inventive concept and methods of accomplishing the same may be understood more readily by reference to the following detailed description of embodiments and the accompanying drawings. Hereinafter, embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
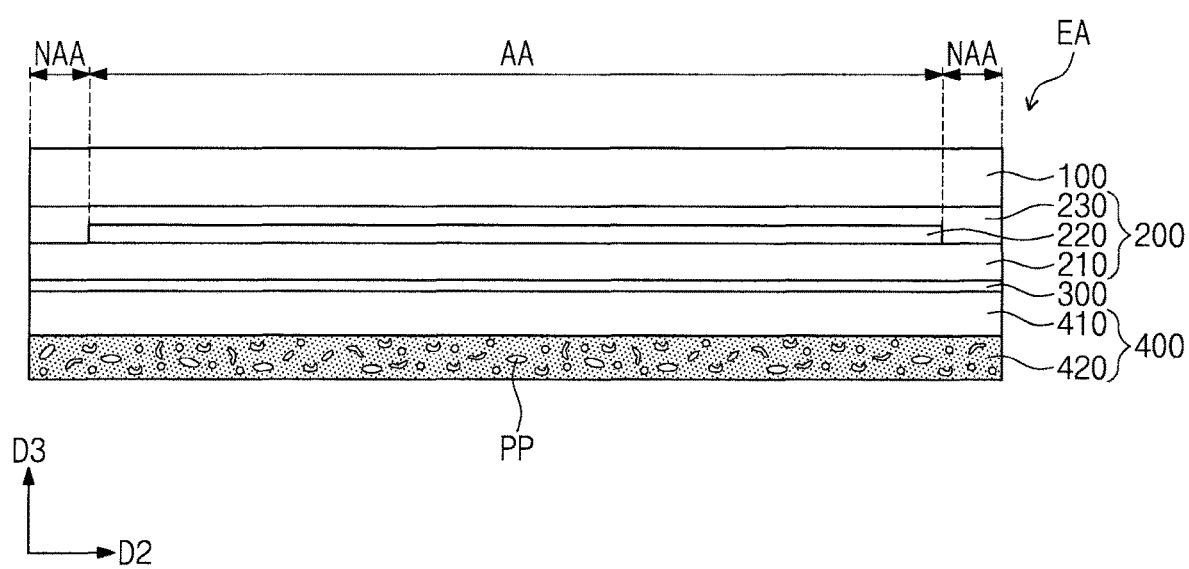
FIG. 1B is a cross-sectional view of the electronic device illustrated in FIG. 1A.

FIG. 1A is an exploded perspective view illustrating an electronic device according to an embodiment of the invention. FIG. 1B is a cross-sectional view illustrating the electronic device EA of FIG. 1A, components of which are coupled to each other. Hereinafter, the electronic device EA according to an embodiment will be described with reference to FIGS. 1A and 1B.

The electronic device EA includes a window member 100, an electronic panel 200, an adhesive member 300, and a protective member 400.

The window member 100 may have a plate shape that is parallel to a plane defined by first and second directions D1 and D2 intersecting each other and has a thickness defined in a third direction D3. The window member 100 may be optically transparent. Thus, the electronic panel 200 may be visible to the outside through the window member 100. In addition, the window member 100 may protect the electronic panel 200 from external environment.

Meanwhile, the window member 100 may include a flexible insulating material. Thus, when the electronic device EA is a foldable device, the window member 100 may easily respond to shape the deformation of the electronic device EA, and may stably protect the electronic panel 200 in the state in which the shape of the electronic device EA is deformed.

The electronic panel 200 may be activated by an electrical signal applied thereto. The electronic panel 200 may have an active area AA and a peripheral area NAA, which are in a plane defined by the first and second directions D1 and D2.

The active area AA may be electrically activated when an electrical signal is supplied thereto. The active area AA may be activated to have at least one of various functions on the basis of a use of the electronic panel 200.

For example, the active area AA may be a sensing area that senses an externally supplied input. In this case, the electronic device EA may function as an input device.

The input provided from the outside may be provided in various forms. For example, the input may be, but is not limited to, contact or touch of a portion of a human body (e.g., a finger of a user), force, pressure, and/or light.

In certain embodiments, the active area AA may be a display area that displays information. The electronic panel 200 may display an image on the active area AA, and a user may obtain information through the image. In this case, the electronic device EA may function as an output device.

The peripheral area NAA is adjacent to the active area AA. Even though an electrical signal is applied to the peripheral area NAA, the peripheral area NAA does not display an image and/or does not sense an external input.

Signal lines and/or driving elements may be located in the peripheral area NAA. The signal lines may be provided for supplying externally received signals to the active area AA, and the driving elements may be provided for driving the active area AA. The peripheral area NAA may be adjacent to a side of the active area AA.

In the present embodiment, the peripheral area NAA has a frame shape that surrounds the active area AA. However, embodiments are not limited thereto. In certain embodiments, the peripheral area NAA may be omitted from the electronic device EA. In some embodiments, the shape of the peripheral area NAA may be variously defined, and is not limited to a specific shape.

The electronic panel 200 may include a first layer 210, an element layer 220, and a second layer 230. The first layer 210, the element layer 220, and the second layer 230 may be sequentially stacked in the third direction D3.

The first layer 210 may be a base layer on which the element layer 220 is located. The first layer 210 may include an insulating material. For example, the first layer 210 may be an insulating substrate, an insulating film, or an insulating thin layer.

The element layer 220 may include a display element for generating an image by electrical signals applied to the electronic panel 200, or may include a sensing element for sensing an external input. The active area AA may be substantially defined by the element layer 220.

In the present embodiment, the element layer 220 is illustrated as a single layer. However, the element layer 220 is schematically illustrated in the present embodiment. In certain embodiments, the element layer 220 may have a multi-layered structure including one or more conductive layers and one or more insulating layers. However, embodiments are not limited to a specific embodiment.

The second layer 230 is located on the first layer 210 and covers the element layer 220. The second layer 230 electrically insulates the element layer 220 from other components. The second layer 230 may include an insulating material. For example, the second layer 230 may include an organic layer and/or an inorganic layer.

The adhesive member 300 is located under the electronic panel 200. The adhesive member 300 may adhere to components adjacent to the adhesive member 300, and may physically couple two adjacent components to each other. In the present embodiment, the adhesive member 300 couples the electronic panel 200 and the protective member 400 to each other.

The adhesive member 300 may have adhesiveness. For example, the adhesive member 300 may include at least one of an optical clear adhesive (OCA), an optical clear resin (OCR), or a pressure sensitive adhesive (PSR).

The protective member 400 is spaced apart from the electronic panel 200 with the adhesive member 300 interposed therebetween. The protective member 400 may be in contact with the adhesive member 300. The protective member 400 may be coupled to the electronic panel 200 through the adhesive member 300.

The protective member 400 includes a base layer 410 and a cushion layer 420. The base layer 410 may correspond to a base layer on which the cushion layer 420 is located.

The base layer 410 may include an insulating material. For example, the base layer 410 may include an insulating material having flexibility. A shape of the base layer 410 may be easily changed by stress provided from the outside.

In addition, the base layer 410 may include a material having a high glass transition temperature. The base layer 410 may include a material that has a glass transition temperature that is higher than at least a glass transition temperature of polyethylene terephthalate (PET). For example, the base layer 410 may include polyimide (PI), polyethylene naphthalate (PEN), or crystalline polyethylene terephthalate (C-PET).

Because the base layer 410 has a relatively high glass transition temperature, the base layer 410 may have stability against thermal shrinkage and thermal expansion, and may have high thermal processability. Thus, the cushion layer 420 may be stably formed, and reliability of the protective member 400 may be improved. This will be described later in more detail.

The cushion layer 420 is located directly on a bottom surface of the base layer 410. The cushion layer 420 may be in contact with the bottom surface of the base layer 410. An additional adhesive layer need not exist between the cushion layer 420 and the base layer 410. The cushion layer 420 may be formed directly on the base layer 410 to adhere closely to the bottom surface of the base layer 410. This will be described later in more detail.

The cushion layer 420 may have elasticity, and may have a porous structure. A plurality of pores PP may be defined in, or by, the cushion layer 420. The plurality of pores PP may easily absorb an impact applied to the cushion layer 420.

The cushion layer 420 may include synthetic resin foam. For example, the cushion layer 420 may include acrylonitrile butadiene styrene copolymer (ABS) foam, polyurethane (PU) foam, polyethylene (PE) foam, ethylene vinyl acetate (EVA) foam, or polyvinyl chloride (PVC) foam. In certain embodiments, the cushion layer 420 may include a plurality of synthetic resins. However, embodiments are not limited to a specific embodiment.

The electronic device EA according to an embodiment may include the protective member 400 having the stack structure of the base layer 410 and the cushion layer 420, and thus it is possible to improve the reliability of the electronic device EA against an external impact or external stress. The base layer 410 and the cushion layer 420 may be substantially integrated with each other. Thus, it is possible to avoid a delamination phenomenon between the base layer 410 and the cushion layer 420, and the external stress applied to the base layer 410 may be stably absorbed through the cushion layer 420. As a result, it is possible to improve physical properties (e.g., elasticity and impact resistance) of the protective member 400. This will be described later in more detail.

Figure 2:
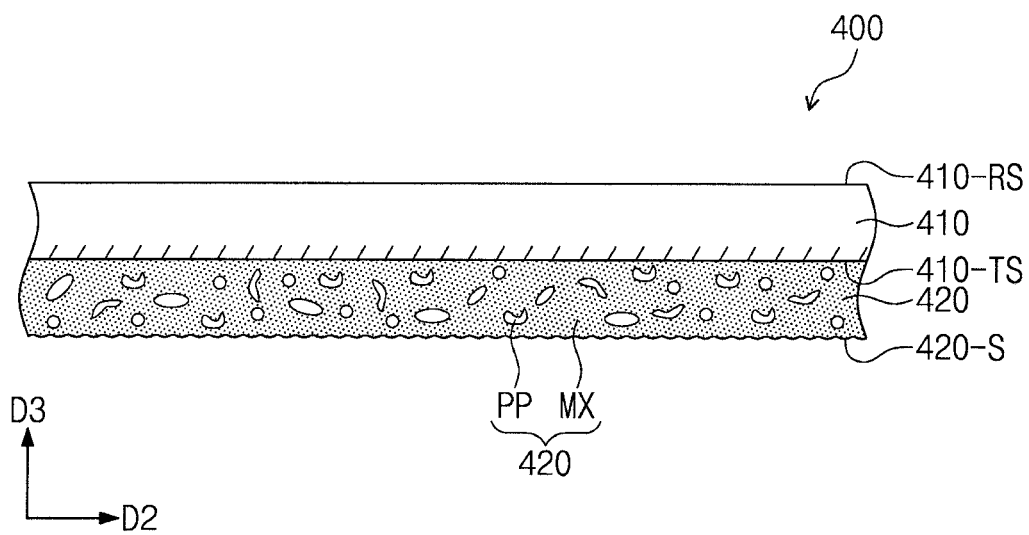
FIG. 2 is a schematic cross-sectional view illustrating some components of the electronic device of FIG. 1A.

FIG. 2 is a schematic cross-sectional view illustrating the protective member 400 of the electronic device of FIG. 1A. Hereinafter, the protective member 400 according to an embodiment will be described in more detail with reference to FIG. 2.

As illustrated in FIG. 2, the base layer 410 includes a first surface 410-RS and a second surface 410-TS, which are opposite to each other in the third direction D3. The first surface 410-RS may face the adhesive member 300 (see FIG. 1A), and the second surface 410-TS may face the cushion layer 420.

The second surface 410-TS may be treated by a surface treatment. Thus, a surface state of the first surface 410-RS may be different from a surface state of the second surface 410-TS. In more detail, the first surface 410-RS may have the same state as the second surface 410-TS before performing the surface treatment on the second surface 410-TS.

The second surface 410-TS may be relatively roughened or hydrophilized as compared with the first surface 410-RS. Thus, an adhesive force between the cushion layer 420 and the second surface 410-TS may be greater than what an adhesive force would be between the cushion layer 420 and the first surface 410-RS, and the cushion layer 420 may be coupled to the second surface 410-TS of the base layer 410.

The cushion layer 420 includes a matrix member MX and a plurality of pores PP. The plurality of pores PP may be defined to be dispersed in the matrix member MX.

The matrix member MX may include a flexible material. For example, the matrix member MX may include a synthetic resin. For example, the matrix member MX may include at least one of acrylonitrile butadiene styrene copolymer (ABS), polyurethane (PU), polyethylene (PE), ethylene vinyl acetate (EVA), or polyvinyl chloride (PVC).

Because the cushion layer 420 has the porous structure, the plurality of pores PP may be defined in the cushion layer 420. The plurality of pores PP may allow the shape of the cushion layer 420 to be easily deformed, and thus the elasticity of the cushion layer 420 may be improved and the impact resistance of the protective member 400 may be improved.

On the other hand, as illustrated in FIG. 2, an outer surface 420-S of the cushion layer 420 may have a degree of roughness. In detail, the outer surface 420-S of the cushion layer 420 may have concave and convex portions, and may be uneven.

The cushion layer 420 according to an embodiment is formed directly on the second surface 410-TS of the base layer 410. At this time, a foaming process for forming the porous structure of the cushion layer 420 may be performed directly on the second surface 410-TS of the base layer 410. Thus, when an additional process is omitted, the outer surface 420-S of the cushion layer 420 may be realized as an uneven surface having concave and convex portions.

Figure 3:
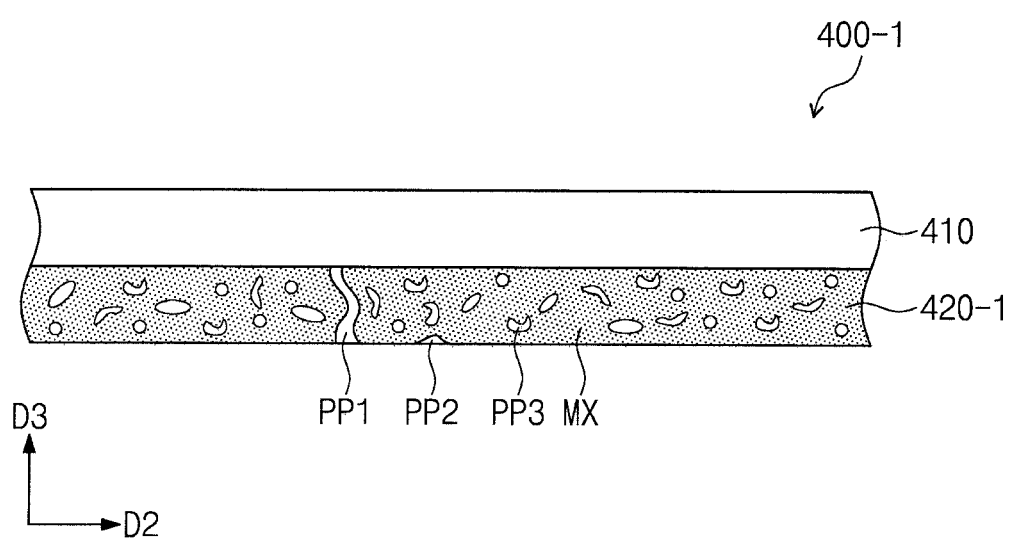
FIG. 3 is a schematic cross-sectional view illustrating a protective member according to an embodiment of the invention.

FIG. 3 is a schematic cross-sectional view illustrating a protective member according to an embodiment. Portions of a protective member 400-1, which correspond to the portions of FIG. 2, are illustrated in FIG. 3 for the purpose of ease and convenience in description.

Hereinafter, the protective member 400-1 according to an embodiment will be described with reference to FIG. 3. In the present embodiment, the same components as described with reference to FIG. 2 will be indicated by the same reference numerals or designators, and repeated descriptions thereof will omitted.

As illustrated in FIG. 3, a cushion layer 420-1 may include a matrix member MX in which various pores may be dispersed. A first pore PP1, a second pore PP2, and a third pore PP3 are illustrated as an example in FIG. 3.

The first pore PP1 may be defined to penetrate through the cushion layer 420-1. In other words, the first pore PP1 is formed to penetrate the matrix member MX. Thus, the first pore PP1 may be exposed at both an inner surface and an outer surface of the cushion layer 420-1. The inner surface of the cushion layer 420-1 may be in contact with the base layer 410, and the outer surface of the cushion layer 420-1 may be opposite to the inner surface.

The second pore PP2 may be defined to be exposed at only one surface of the cushion layer 420-1. For example, the second pore PP2 may be exposed at the outer surface of the cushion layer 420-1 while not being exposed at the inner surface of the cushion layer 420-1. The second pore PP2 may form an area that is partially recessed at the outer surface of the cushion layer 420-1.

The third pore PP3 may be defined to not be exposed at any surface of the cushion layer 420-1. The third pore PP3 is formed within the matrix member MX, and is not exposed at the inner surface or the outer surface of the cushion layer 420-1.

The first to third pores PP1, PP2, and PP3 may be provided in various forms by a gas formation condition and/or by a distribution environment in a foaming process. Under a condition that the protective member 400-1 according to an embodiment has improved impact resistance, the protective member 400-1 may include the cushion layer 420-1 in which the pores having various shapes are defined. In these cases, shapes of the pores are not limited to a specific shape. In some embodiments, the pores may not be uniform.

Figure 4:
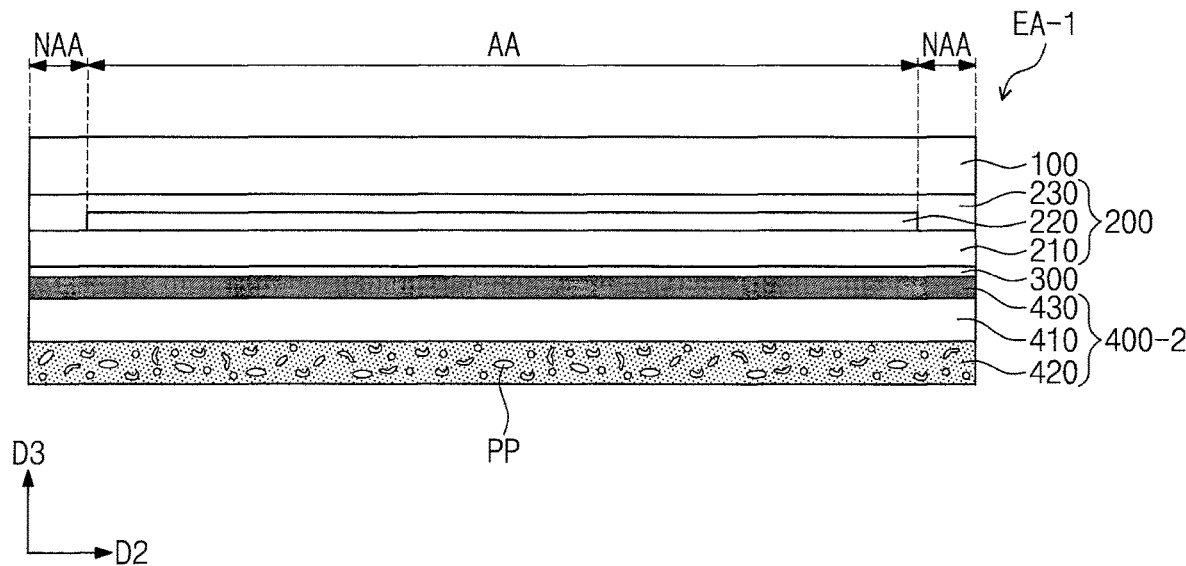
FIG. 4 is a cross-sectional view illustrating an electronic device according to an embodiment of the invention.

FIG. 4 is a cross-sectional view illustrating an electronic device according to an embodiment. FIG. 4 illustrates a schematic cross-sectional view of an electronic device EA-1 according to an embodiment. Hereinafter, the electronic device EA-1 will be described with reference to FIG. 4. In addition, the same components as described with reference to FIGS. 1A, 1B, 2, and 3 will be indicated by the same reference numerals or designators, and repeated descriptions thereof will be omitted for the sake of convenience.

As illustrated in FIG. 4, the electronic device EA-1 may include a protective member 400-2 that further includes a light-shielding layer 430. The light-shielding layer 430 is located on the base layer 410. Thus, the adhesive member 300 may be in contact with the light-shielding layer 430.

The light-shielding layer 430 may optically block about 90% or more of incident light. The light-shielding layer 430 may solve a problem wherein components located under the light-shielding layer 430 are otherwise visible to a user through the active area AA.

The light-shielding layer 430 may be in contact with the first surface 410-RS (see FIG. 2) of the base layer 410. In more detail, an additional adhesive layer is not interposed between the base layer 410 and the light-shielding layer 430, and the light-shielding layer 430 may adhere closely to the first surface 410-RS of the base layer 410.

The light-shielding layer may include a binder and a plurality of pigment particles dispersed in the binder. The pigment particles may include, for example, carbon black. The light-shielding layer 430 may be printed directly on the first surface 410-RS of the base layer 410.

Because the electronic device EA-1 according to an embodiment includes the protective member 400-2 further including the light-shielding layer 430, the electronic device EA-1 may have both the improved impact resistance and the improved light shielding characteristic due to a single protective member 400-2. In particular, the light-shielding layer 430 may be located directly on the base layer 410, and thus it is possible to prevent a separation phenomenon of layers, which may be caused by an adhesive layer. As a result, the electronic device EA-1 can have both the improved visibility and the improved reliability against external impact or stress occurring in a use process.

Figure 5:
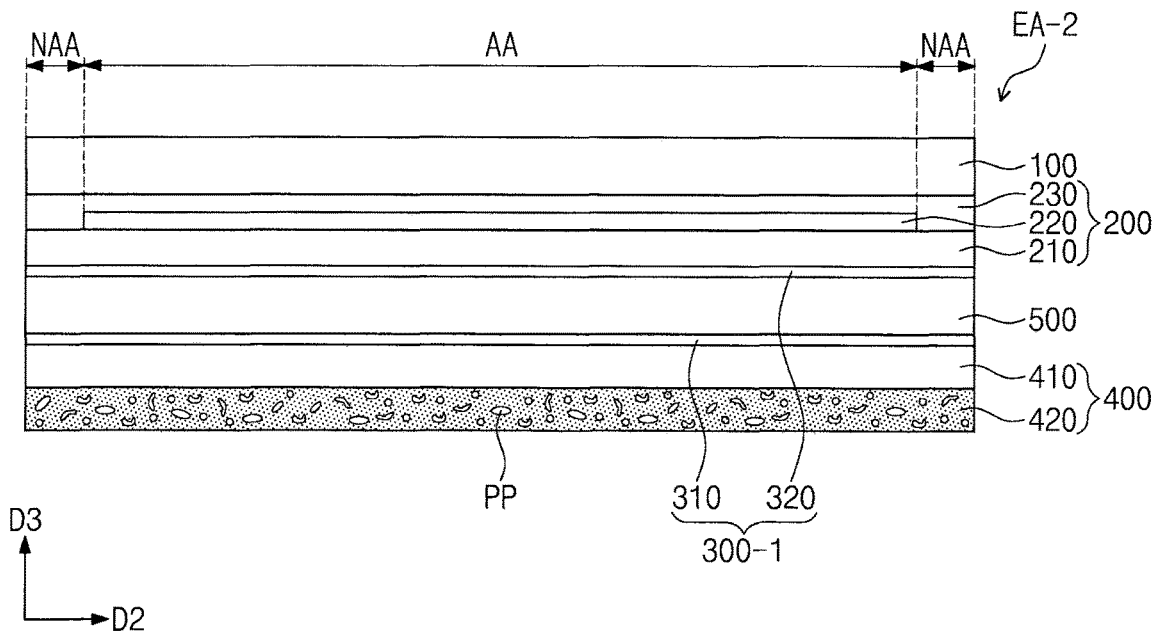
FIG. 5 is a cross-sectional view illustrating an electronic device according to an embodiment of the invention.

FIG. 5 is a cross-sectional view illustrating an electronic device EA-2 according to an embodiment. Hereinafter, the electronic device EA-2 will be described with reference to FIG. 5. In addition, the same components as described with reference to FIGS. 1A, 1B, 2 to 4 will be indicated by the same reference numerals or designators, and the descriptions thereto will be omitted for the purpose of ease and convenience in description and illumination.

As illustrated in FIG. 5, the electronic device EA-2 may further include a lower protective member 500. The lower protective member 500 may be located between the protective member 400 and the electronic panel 200.

The lower protective member 500 may include a material having a relatively high hardness. For example, the lower protective member 500 may include polyimide (PI), polycarbonate, or polyethylene terephthalate (PET).

The electronic device EA-2 may include a plurality of adhesive members 300-1. The plurality of adhesive members 300-1 may include a first adhesive member 310 and a second adhesive member 320, which are located on a bottom surface and a top surface of the lower protective member 500, respectively.

The first adhesive member 310 is located between the bottom surface of the lower protective member 500 and the protective member 400 to physically couple the lower protective member 500 to the protective member 400. The first adhesive member 310 is in contact with the lower protective member 500 and the protective member 400.

The second adhesive member 320 is located between the top surface of the lower protective member 500 and the electronic panel 200 to physically couple the electronic panel 200 to the lower protective member 500. The second adhesive member 320 is in contact with the lower protective member 500 and the electronic panel 200.

On the other hand, an additional adhesive member is not interposed between the base layer 410 and the cushion layer 420 of the protective member 400 in the electronic device EA-2, according to the present embodiment. Because the cushion layer 420 according to an embodiment is formed directly on the base layer 410, the cushion layer 420 is physically coupled to the base layer 410 without an additional adhesive member. As a result, the structure of the cushion layer 420 according to the invention is different from that of a cushion layer coupled to a base layer or a lower protective member through an adhesive member.

The lower protective member 500 protects the electronic panel 200 from an external impact. As a result, the electronic panel 200 may be protected by both the protective member 400 and the lower protective member 500, and thus the reliability of the electronic device EA-2 may be improved.

Figure 6A:
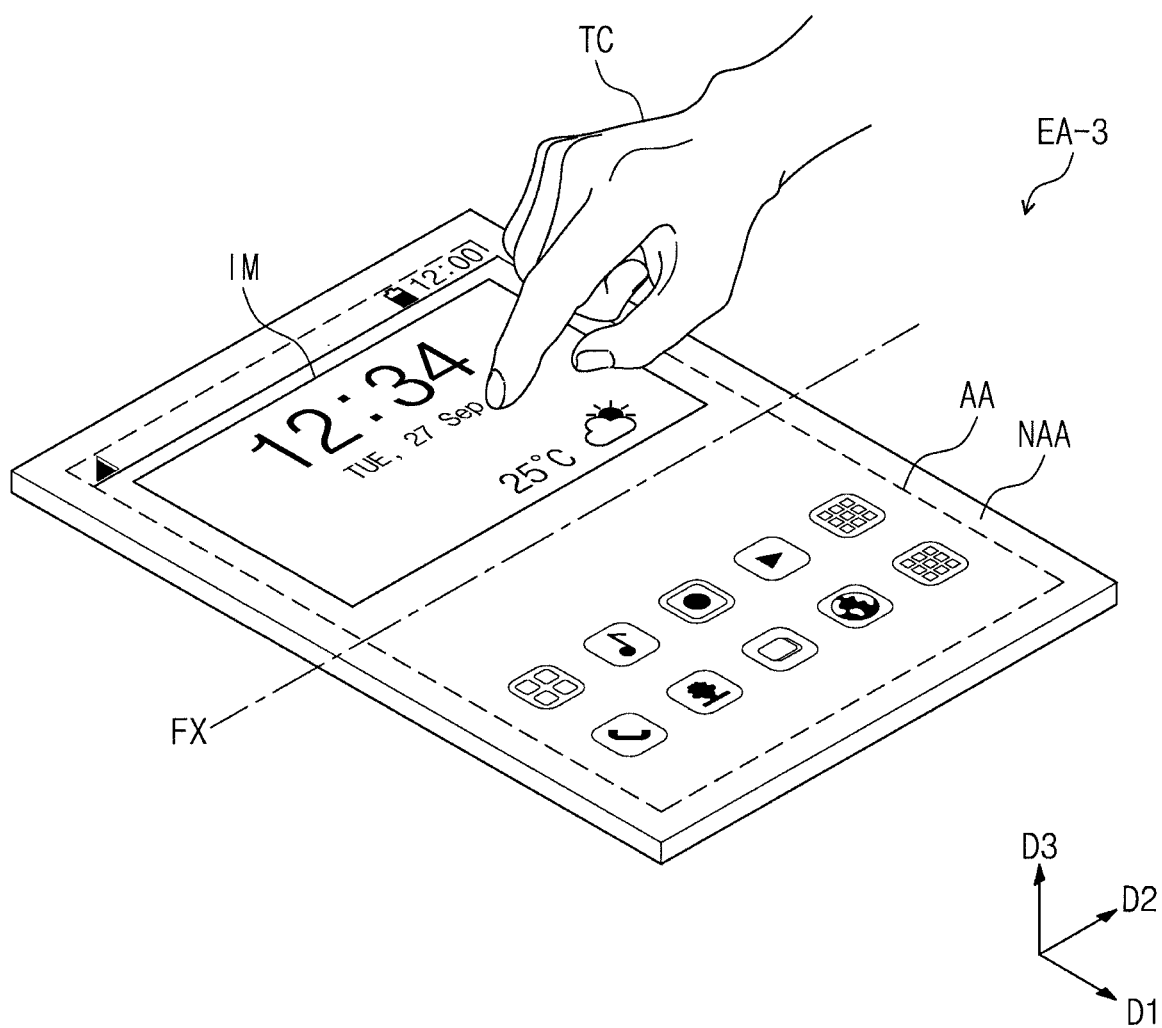
FIG. 6A is a schematic perspective view illustrating an electronic device according to an embodiment of the invention.
Figure 6B:
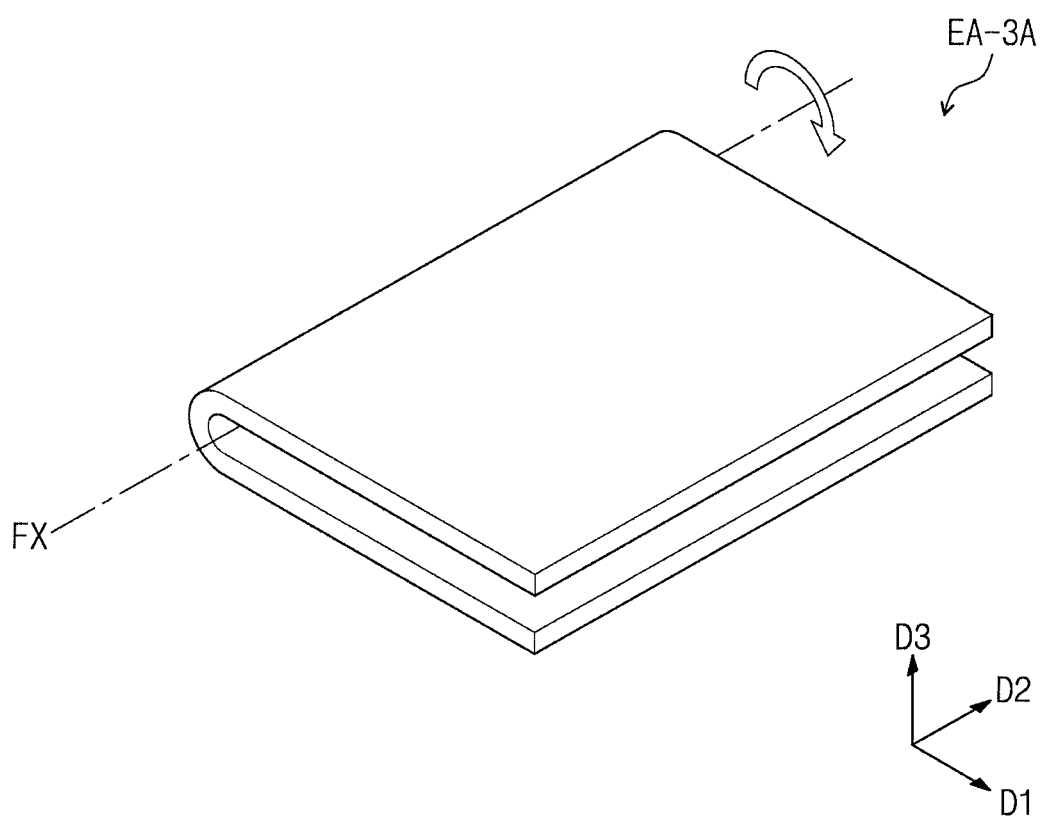
FIGS. 6B and 6C are perspective views illustrating the electronic device of FIG. 6A in other states.
Figure 6C:
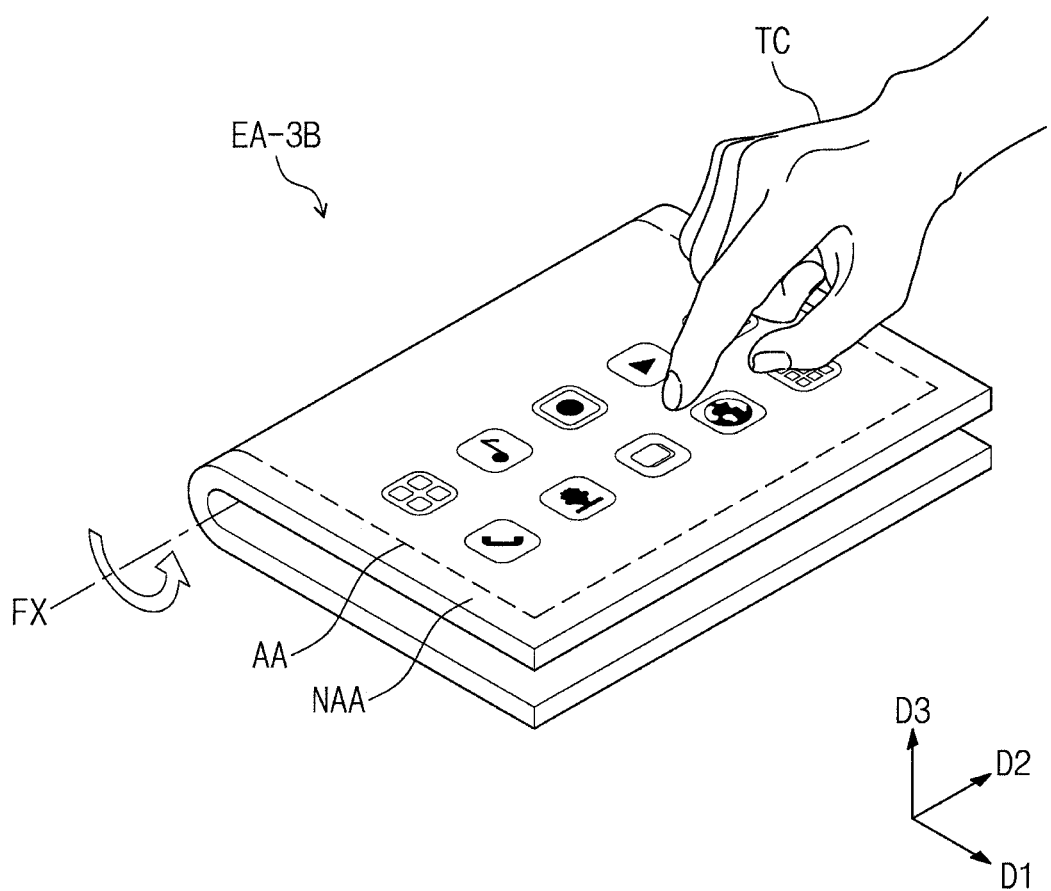

FIG. 6A is a schematic perspective view illustrating an electronic device according to an embodiment. FIGS. 6B and 6C are perspective views illustrating the electronic device of FIG. 6A in other states.

FIG. 6A illustrates a perspective view of an electronic device EA-3 in a first mode, FIG. 6B illustrates a perspective view of the electronic device EA-3 in a second mode, and FIG. 6C illustrates a perspective view of the electronic device EA-3 in a third mode. The first to third modes may operate for different times or applications from each other. Hereinafter, the electronic device EA-3 according to an embodiment will be described with reference to FIGS. 6A to 6C. In addition, the same components as described with reference to FIGS. 1A, 1B, 2 to 5 will be indicated by the same reference numerals or designators, and repeated descriptions thereto will be omitted for the purpose of ease and convenience in description and illumination.

As illustrated in FIGS. 6A to 6C, the electronic device EA-3 may be a touch screen device. Thus, the electronic device EA-3 may display an image IM on its active area AA to provide information to a user or to communicate with a user.

In addition, the electronic device EA-3 may sense an external input TC applied to the active area AA. The external input TC that is a finger of a user is illustrated as an example in FIG. 6A. However, other embodiments are not limited thereto. The electronic device EA-3 may sense at least one of various external inputs on the basis of a kind of a sensing element included in the electronic device EA-3.

In some embodiments, the electronic device EA-3 may be folded or unfolded with respect to a folding axis FX. The folding axis FX is defined as a line extending in the second direction D2.

FIG. 6A illustrates the first mode of the electronic device EA-3. The first mode may be a state in which the electronic device EA-3 is unfolded. In the first mode, external stress applied to the electronic device EA-3, with the exception of the external input TC, may be zero. Thus, the shape of the electronic device EA-3 is not deformed in the first mode.

FIG. 6B illustrates the second mode of the electronic device EA-3. The second mode may be a state in which an electronic device EA-3A is folded on the folding axis FX in one direction. At this time, first stress, or force, may be applied to the electronic device EA-3A, and the electronic device EA-3A may be folded in a direction in which a surface having the active area AA surrounds the folding axis FX (e.g., is folded inward). Thus, the active area AA is not visible to the outside.

FIG. 6C illustrates the third mode of the electronic device EA-3. The third mode may be a state in which an electronic device EA-3B is folded on the folding axis FX in a direction that is different from the folding direction of the second mode. At this time, second stress/force may be applied to the electronic device EA-3B, and the electronic device EA-3B may be folded such that the surface having the active area AA faces outwardly. Thus, the electronic device EA-3B may sense the external input TC or may provide an image IM in the folded state (i.e., in the third mode).

Meanwhile, the electronic device EA-3 according to an embodiment may operate in only one of the second mode and the third mode or may operate in both the second mode and the third mode. In other words, the invention is not limited to a specific embodiment.

In accordance with the modes, external stress may be applied to the electronic device EA-3, and the shape of the electronic device EA-3 may be deformed. The electronic device EA-3 may be stably driven even though its shape is variously changed in a process of use. In addition, the electronic device EA-3 may have improved reliability against stresses caused by repeated folding operations. This will be described later in more detail.

Figure 7A:
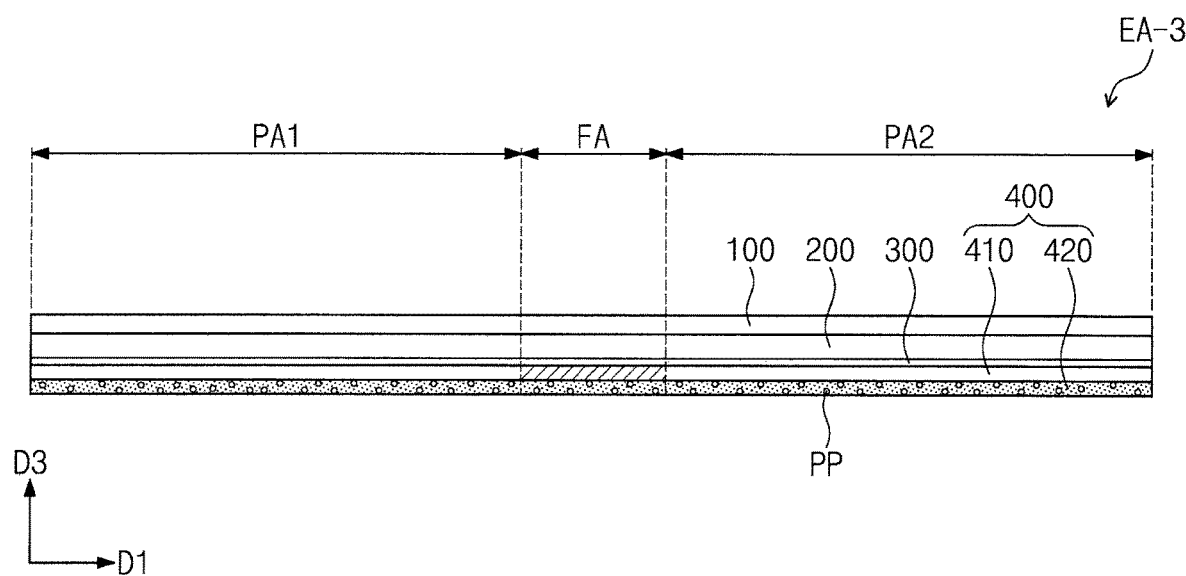
FIG. 7A is a cross-sectional view of the electronic device illustrated in FIG. 6A.
Figure 7B:
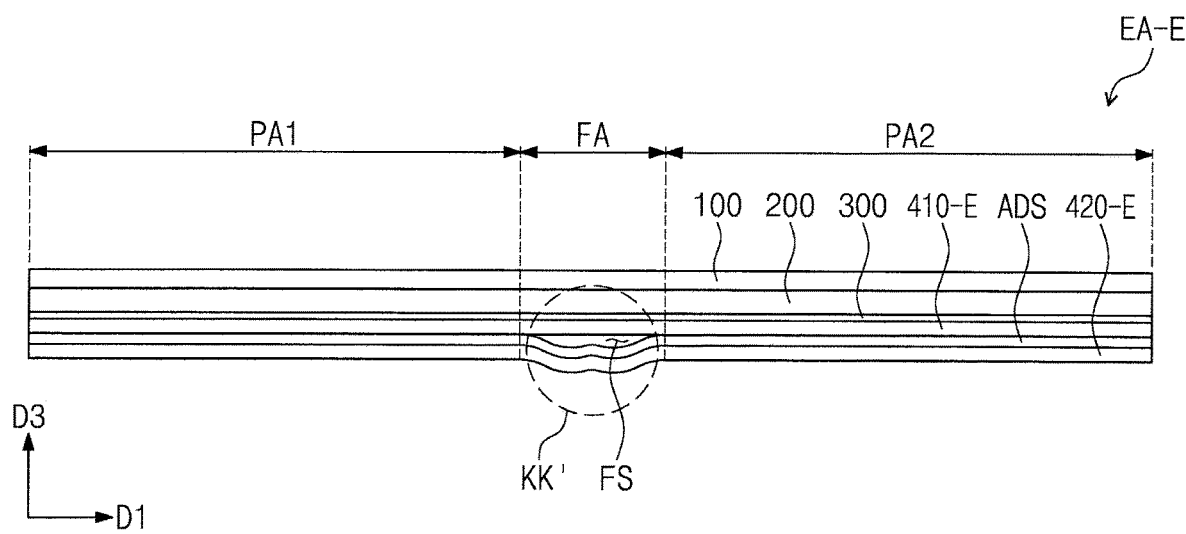
FIG. 7B is a cross-sectional view of an electronic device according to a comparative example.
Figure 8A:
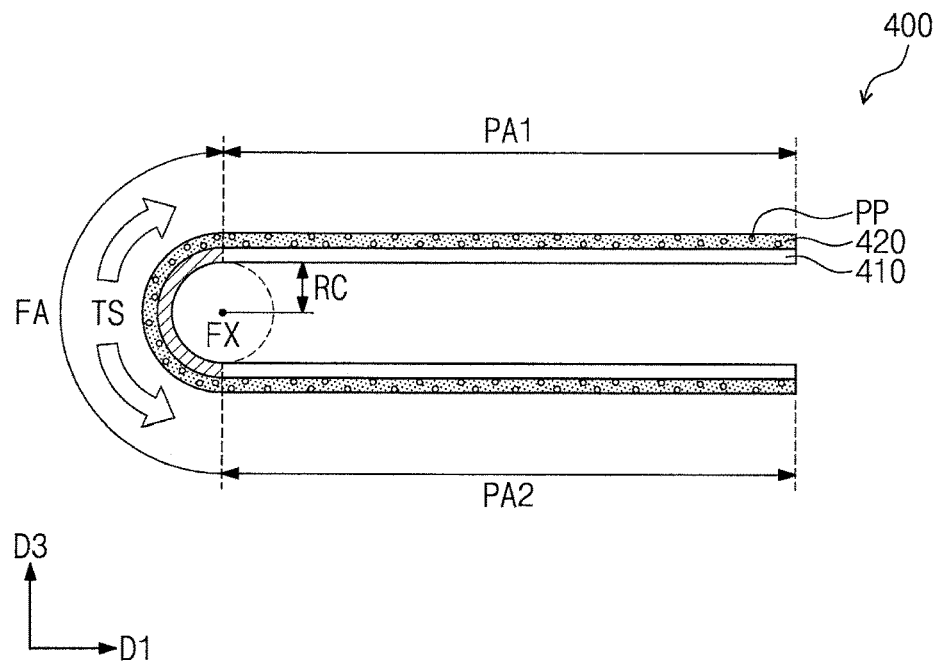
FIGS. 8A and 8B are cross-sectional views illustrating some components of the electronic device of FIG. 7A.
Figure 8B:
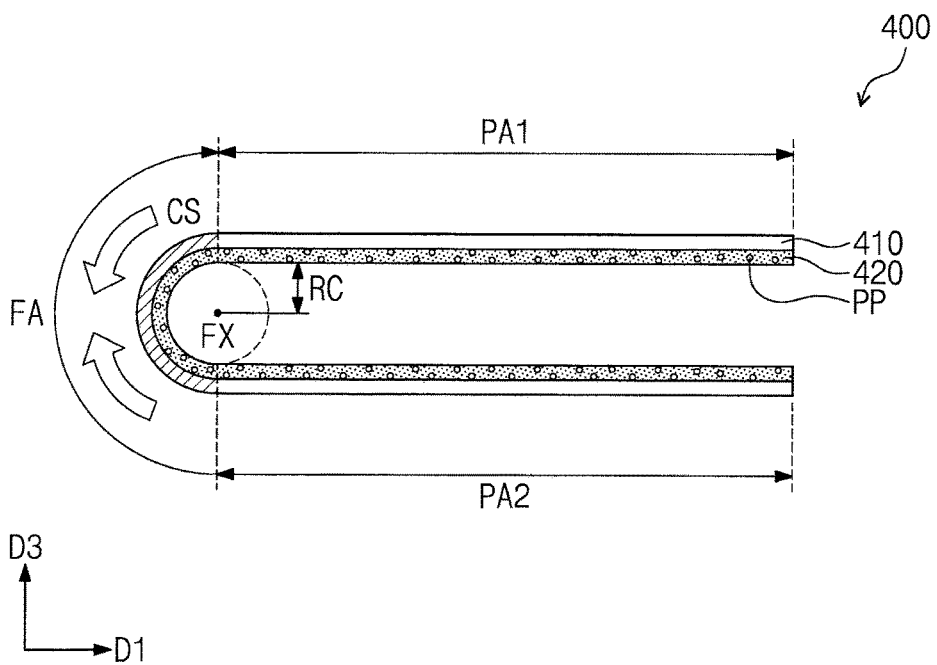

FIG. 7A is a cross-sectional view of the electronic device illustrated in FIG. 6A. FIG. 7B is a cross-sectional view of an electronic device according to a comparative example. FIGS. 8A and 8B are cross-sectional views illustrating some components of the electronic device of FIG. 7A.

FIG. 7A illustrates a cross-sectional view of an electronic device in the first mode corresponding to FIG. 6A, and FIG. 7B illustrates a cross-sectional view of an electronic device according to a comparative example, which corresponds to FIG. 7A. FIG. 8A illustrates a partial cross-sectional view of an electronic device in the second mode corresponding to FIG. 6B, and FIG. 8B illustrates a partial cross-sectional view of an electronic device in the third mode corresponding to FIG. 6C.

Hereinafter, an electronic device according to an embodiment will be described with reference to FIGS. 7A to 8B. In addition, the same components as described with reference to FIGS. 1A to 6C will be indicated by the same reference numerals or designators, and the repeated descriptions thereto will be omitted or merely mentioned briefly for the purpose of ease and convenience in description and illumination.

As illustrated in FIG. 7A, the electronic device EA-3 includes a window member 100, an electronic panel 200, an adhesive member 300, and a protective member 400. The protective member 400 includes a base layer 410 and a cushion layer 420. These components 100, 200, 300, 400, 410, and 420 may be substantially the same as described with reference to FIG. 2, and thus the descriptions thereto will be omitted.

Referring to FIGS. 7A, 8A, and 8B, the electronic device EA-3 may include a folding area FA, a first planar area PA1, and a second planar area PA2. The first planar area PA1, the folding area FA, and the second planar area PA2 may be sequentially arranged in the first direction D1. The electronic device EA-3 may be folded on the folding axis FX, and may be folded to have a radius of curvature (e.g. a predetermined radius of curvature) RC.

In FIGS. 8A and 8B, only the protective member 400 is illustrated for the purpose of ease and convenience in description and illumination. Referring to FIGS. 8A and 8B, shapes of the first and second planar areas PA1 and PA2 are not deformed even though the electronic device EA-3 is folded on the folding axis FX. External stress applied to each of the first and second planar areas PA1 and PA2 may be substantially zero in each of the second mode and the third mode.

A shape of the folding area FA may be deformed as the electronic device EA-3 is folded on the folding axis FX. Folding stresses are applied to the base layer 410 and the cushion layer 420 in the folding area FA, respectively.

At this time, because a distance of the base layer 410 from the folding axis FX is different from a distance of the cushion layer 420 from the folding axis FX, the folding stress applied to the base layer 410 is different from the folding stress applied to the cushion layer 420. In addition, because the base layer 410 and the cushion layer 420 include different materials from each other, the base layer 410 and the cushion layer 420 may have shape deformation rates that are different from each other.

For example, in the second mode, the electronic device EA-3 is folded such that the electronic panel 200 (see FIG. 7A) is located inside the protective member 400, as illustrated in FIGS. 6B and 8A. Thus, the folding area FA of the protective member 400 may be relatively affected by tensile stress TS, as compared with the electronic panel 200 or the window member 100. A hatched portion of the base layer 410 absorbs the tensile stress TS through shape deformation.

At this time, as illustrated in FIG. 8A, a distance between the base layer 410 and the folding axis FX is less than a distance between the cushion layer 420 and the folding axis FX. In other words, the base layer 410 is closer to the folding axis FX than the cushion layer 420. Thus, a magnitude of the stress (e.g., tensile stress TS) provided to the folding area FA of the base layer 410 may be less than a magnitude of the stress provided to the folding area FA of the cushion layer 420.

In other embodiments, in the third mode, the electronic device EA-3 is folded such that the electronic panel 200 is located outside the protective member 400, as illustrated in FIGS. 6C and 8B. Thus, the folding area FA of the protective member 400 may be relatively affected by compressive stress CS, as compared with the electronic panel 200 or the window member 100. In the folding area FA, a hatched portion of the base layer 410 absorbs the compressive stress CS through the shape deformation.

At this time, as illustrated in FIG. 8B, a distance between the cushion layer 420 and the folding axis FX is less than a distance between the base layer 410 and the folding axis FX. In other words, the cushion layer 420 is closer to the folding axis FX than the base layer 410. Thus, a magnitude of the compressive stress CS provided to the folding area FA of the base layer 410 may be less than a magnitude of the compressive stress CS provided to the folding area FA of the cushion layer 420.

Referring again to FIGS. 7A, 8A, and 8B, the base layer 410 and the cushion layer 420 may be provided with the stresses having different magnitudes in accordance with the mode of the electronic device EA-3, and a degree of the shape deformation of the base layer 410 may be different from that of the cushion layer 420 in accordance with the mode of the electronic device EA-3. At this time, because the cushion layer 420 has the elasticity and the porous structure, the shape of the cushion layer 420 may be more easily deformed by the different stresses than the shape of the base layer 410. The cushion layer 420 may suitably respond to the shape deformation of the base layer 410.

As a result, because the protective member 400 includes the base layer 410 and the cushion layer 420 that are independent of each other, and because the protective member 400 has an integrated structure, the folding structure occurring in the base layer 410 may be easily dispersed through the cushion layer 420. Thus, it is possible to inhibit or prevent the delamination phenomenon between the base layer 410 and the cushion layer 420, caused by a folding stress difference.

Contrastingly, referring to FIG. 7B, an electronic device EA-E according to the comparative example includes a base layer 410-E and a cushion layer 420-E, which are coupled to each other through an adhesive layer ADS. At this time, the cushion layer 420-E may be provided in the form of a film and may be adhered to the base layer 410-E through the adhesive layer ADS.

When the electronic device EA-E according to the comparative example is folded as illustrated in FIGS. 8A and 8B, different folding stresses may be applied to the base layer 410-E and the cushion layer 420-E, respectively. In addition, because the base layer 410-E and the cushion layer 420-E have different respective deformation rates, a degree of the deformation of the base layer 410-E for relaxing the folding stress applied thereto may be different from a degree of the deformation of the cushion layer 420-E for relaxing the folding stress applied thereto.

At this time, folding stress may also be applied to the adhesive layer ADS located between the base layer 410-E and the cushion layer 420-E, and thus a shape of the adhesive layer ADS may be deformed.

As shown in a deformed area KK' of the folding area FA, a space FS may be formed between the adhesive layer ADS and the base layer 410-E. This may be due to a delamination phenomenon that occurs between the cushion layer 420-E and the base layer 410-E while the cushion layer 420-E and the base layer 410-E are deformed by the folding stresses.

Meanwhile, the cushion layer 420-E of the comparative example may be provided in the form of a film as described above, and thus elasticity and impact resistance of the cushion layer 420-E may be lower than those of the porous cushion layer 420 of embodiments of the described invention. Thus, it is relatively difficult for the cushion layer 420-E to be deformed for relaxing the folding stress, thereby causing a problem that the shape of the cushion layer 420-E is permanently deformed by repeated folding operations, as shown in the comparative example of FIG. 7B. A cushion layer having low elasticity may accelerate the delamination problem.

Because the electronic device EA-3 according to an embodiment includes the cushion layer 420 having the porous structure, the folding stress may be easily relaxed and the electronic device EA-3 may have improved reliability with respect to repeated folding operations.

In addition, because the cushion layer 420 of the electronic device EA-3 adheres closely to the base layer 410 without an additional adhesive member, the protective member 400 having the integrated structure may be provided. Thus, the cushion layer 420 can stably absorb the folding stress applied to the base layer 410. As a result, the impact resistance of the protective member 400 may be improved.

FIGS. 9A to 9G are cross-sectional views illustrating a method of manufacturing an electronic device, according to an embodiment. FIGS. 10A and 10B are enlarged cross-sectional views illustrating a portion of an electronic device according to an embodiment. Hereinafter, a method of manufacturing an electronic device according to an embodiment will be described with reference to FIGS. 9A to 9G, 10A, and 10B.

Figure 9A:
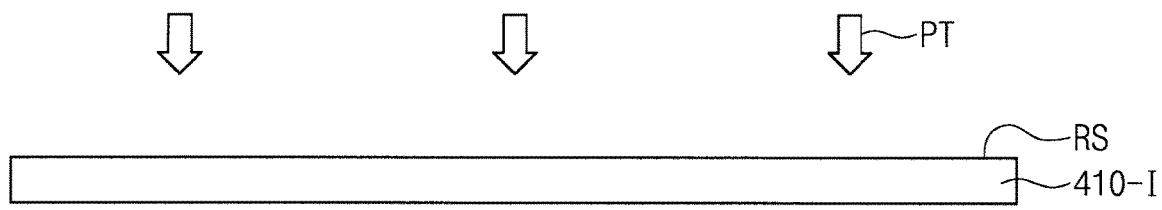
FIGS. 9A to 9G are cross-sectional views illustrating a method of manufacturing an electronic device, according to an embodiment of the invention.
Figure 9B:
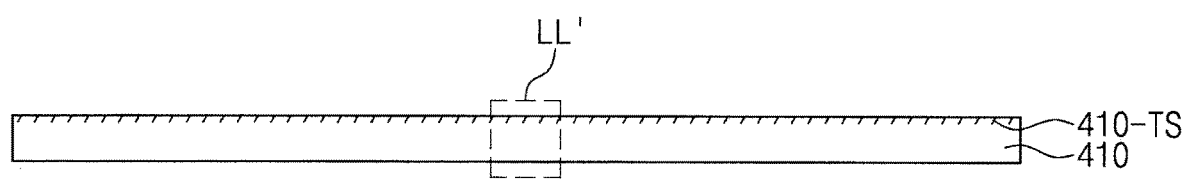
Figure 10A:
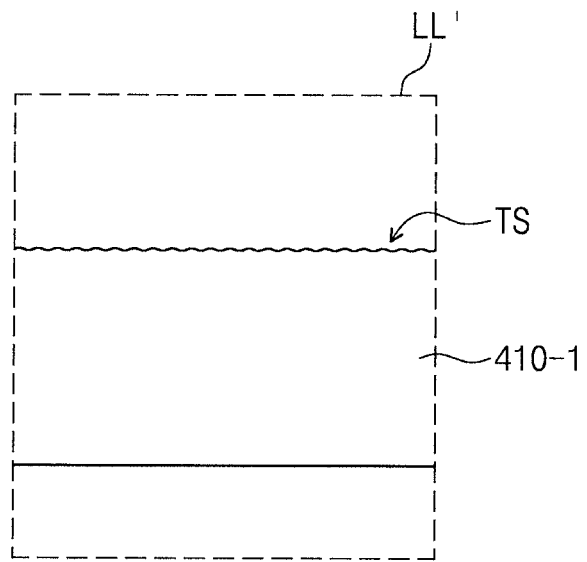
FIGS. 10A and 10B are enlarged cross-sectional views illustrating a portion of an electronic device according to an embodiment of the invention.
Figure 10B:
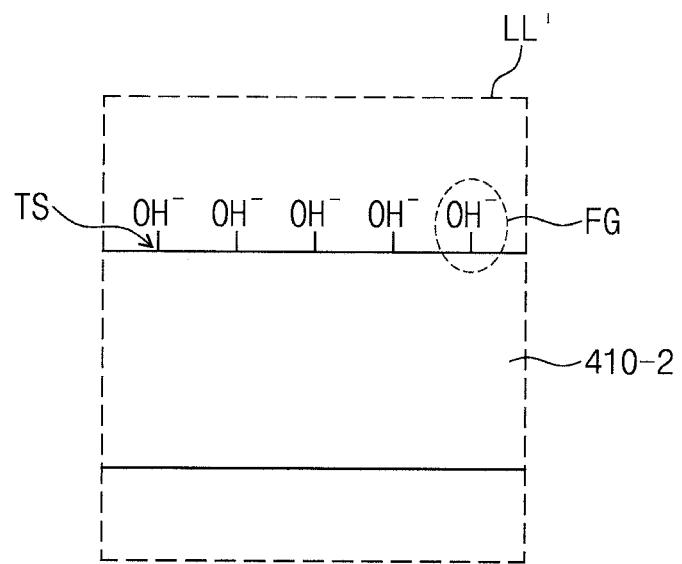

As illustrated in FIGS. 9A and 9B, a surface of an initial layer 410-1 is treated to form a base layer 410. A surface treatment material PT may be provided to a top surface RS of the initial layer 410-I to form a surface-treated top surface 410-TS.

The surface treatment material PT may include gas and/or liquid. For example, the surface treatment material PT may be a plasma gas. The plasma gas may include, but is not limited to, an inert gas or an activated gas.

FIGS. 10A and 10B illustrate enlarged views of a partial area LL' of the surface-treated top surface 410-TS. FIG. 10A illustrates a base layer 410-1 treated by a surface roughening process, and FIG. 10B illustrates a base layer 410-2 treated by hydrophilization. Each of surface-treated top surfaces TS of FIGS. 10A and 10B may correspond to the surface-treated top surface 410-TS illustrated in FIG. 9B.

Referring to FIG. 10A, the top surface RS of the initial layer 410-I (e.g., see FIG. 9A) may be roughened by the surface treatment. The surface treatment material PT physically etches the top surface RS of the initial layer 410-I to form the surface-treated top surface TS.

Thus, the surface-treated top surface TS may have a non-uniform surface (or an uneven surface), and a roughness of the surface-treated top surface TS may be greater than a roughness of the top surface RS of the initial layer 410-I. In the present embodiment, because the surface-treated top surface TS has the roughened surface, a surface area of the surface-treated top surface TS may be greater than that of the top surface RS of the initial layer 410-I.

Referring to FIG. 10B, the top surface RS of the initial layer 410-I may be hydrophilized by the surface treatment. The surface treatment material PT reacts with the top surface RS of the initial layer 410-I to dispose activating groups FG (e.g., hydroxyl groups (OH$^-$)) on the top surface RS of the initial layer 410-I. In the present embodiment, the surface-treated top surface TS may have hydrophilic properties when compared with the top surface RS of the initial layer 410-I.

Figure 9C:
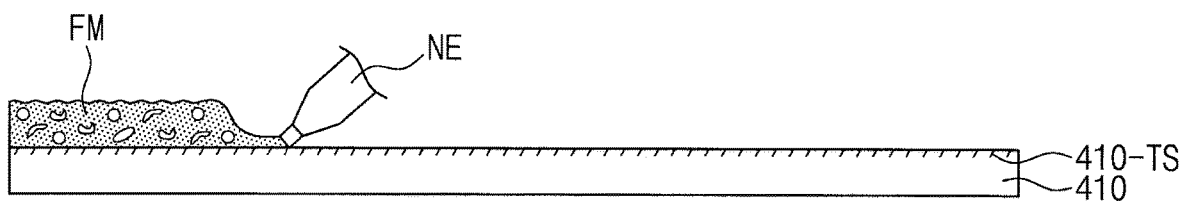
Figure 9D:
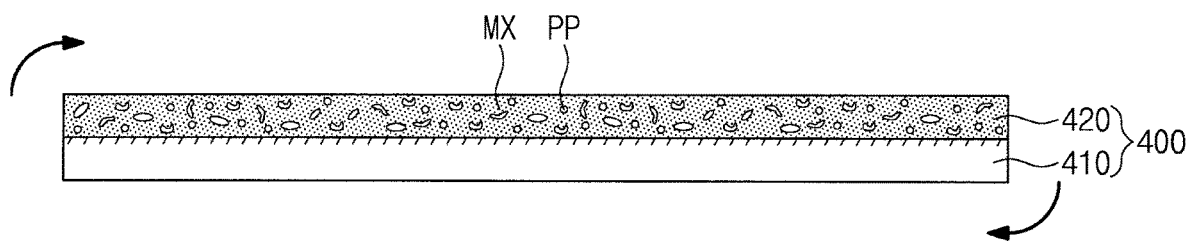

Thereafter, referring to FIGS. 9C and 9D, a foam member FM may be applied to the surface-treated top surface 410-TS of the base layer 410 to form a cushion layer 420. The foam member FM may be provided on the surface-treated top surface 410-TS through an injection tool NE, and the foam member FM covers the surface-treated top surface 410-TS.

At this time, the foam member FM may be formed directly on the surface-treated top surface 410-TS, and may adhere closely to the surface-treated top surface 410-TS. Because the surface on which the foam member FM will be formed is treated in advance by the surface treatment, the adhesiveness of the foam member FM may be improved. Thus, the cushion layer 420 may be stably coupled to the base layer 410 even though an additional adhesive member is not provided.

Meanwhile, the cushion layer 420 may be formed by at least one of various methods. For example, when the cushion layer 420 is formed of polyurethane foam, a mixture of polyol, isocyanate, a foaming agent, a catalyst, and an additive may be provided through the injection tool NE to form the foam member FM in which a foaming phenomenon occurs.

When the foaming phenomenon is finished in the foam member FM, the foam member FM may be formed into the cushion layer 420 in which pores are defined or formed. Thus, the cushion layer 420 may have a porous structure that includes a matrix member MX in which a plurality of pores PP is formed.

On the other hand, heat may occur in the foaming process for forming the cushion layer 420. As described above, the base layer 410 according to an embodiment is formed of polyimide (PI), polyethylene naphthalate (PEN), or crystalline polyethylene terephthalate (C-PET).

The material of the base layer 410 may be a material that has a glass transition temperature higher than at least a glass transition temperature of polyethylene terephthalate (PET). Thus, in the foaming process in which the heat occurs, the base layer 410 may not be damaged but may be maintained in a stable state. As a result, process reliability of the protective member 400 may be improved.

Figure 9E:
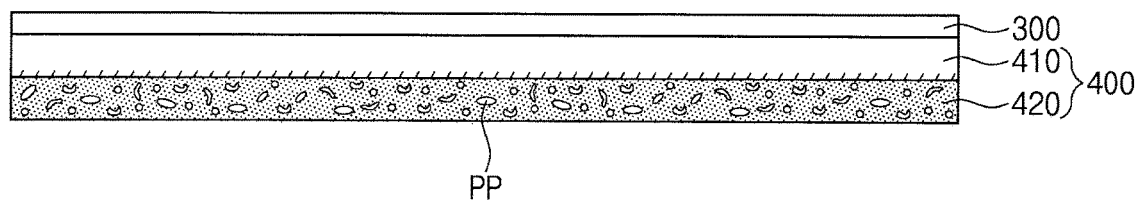

Next, as illustrated in FIGS. 9D and 9E, an adhesive member 300 is formed on one surface of the protective member 400. When the protective member 400 is rotated in an arrow direction as illustrated in FIG. 9D, the protective member 400 may be located such that a bottom surface of the base layer 410 faces upward.

Thereafter, as illustrated in FIG. 9E, the adhesive member 300 is formed on the bottom surface of the base layer 410, which corresponds to the first surface 410-RS illustrated in FIG. 2. The adhesive member 300 may be formed by adhering a separately formed adhesive sheet to the bottom surface of the base layer 410. Alternatively, the adhesive member 300 may be formed by applying an adhesive material to the bottom surface of the base layer 410.

Figure 9F:
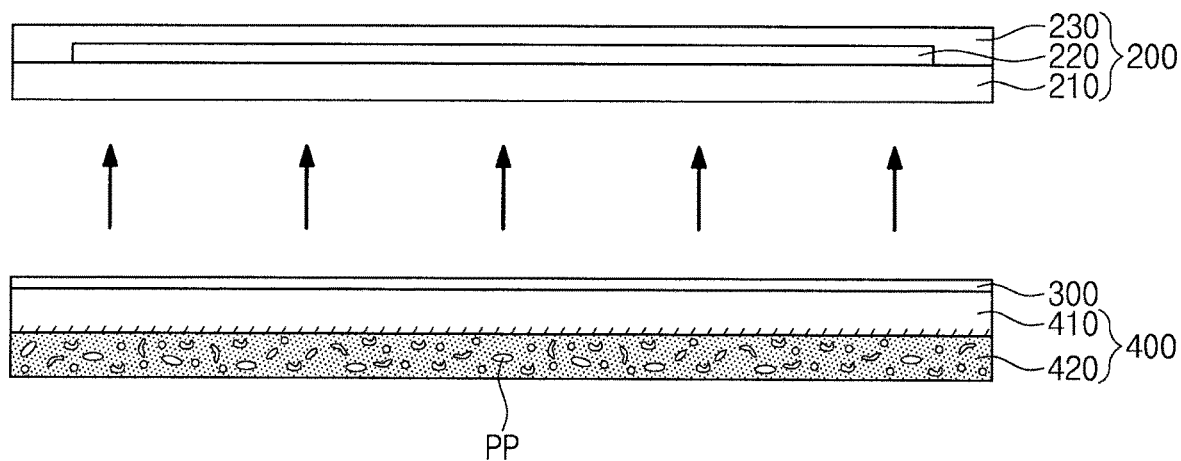

Next, as illustrated in FIG. 9F, the protective member 400 is adhered to one surface of an electronic panel 200 in an arrow direction. The electronic panel 200 includes a first layer 210, an element layer 220, and a second layer 230 that are sequentially stacked. The protective member 400 is adhered to the electronic panel 200 in such a way that the adhesive member 300 faces a bottom surface of the first layer 210, which corresponds to a bottom surface of the electronic panel 200. The electronic panel 200 and the protective member 400 may be stably coupled to each other by the adhesive member 300.

Figure 9G:
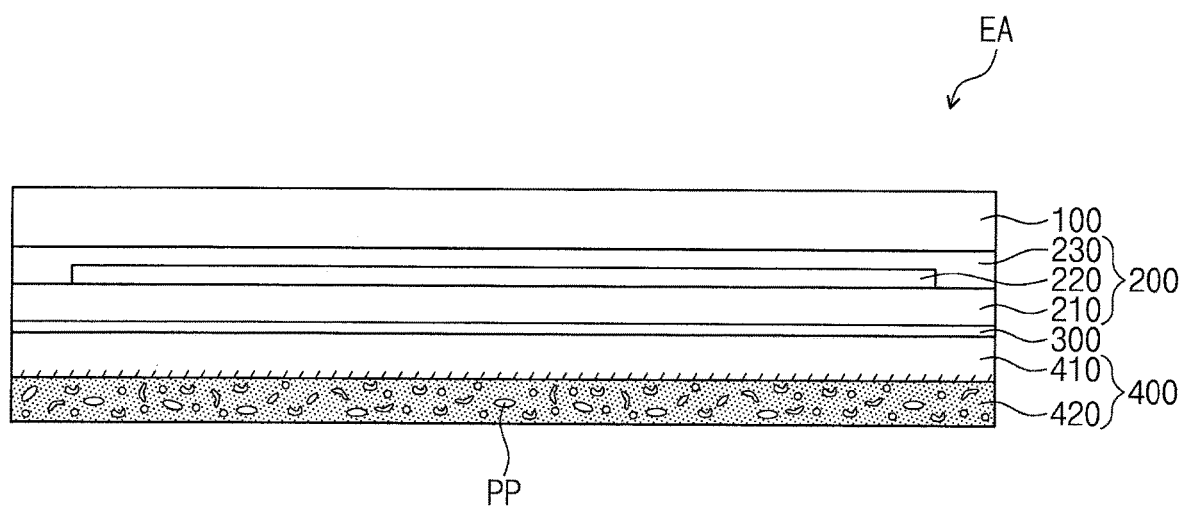

Thereafter, as illustrated in FIG. 9G, a top surface of the electronic panel 200 may be covered with a window member 100, thereby manufacturing an electronic device EA. The window member 100 may be coupled to the electronic panel 200 by a suitable coupling member. The coupling member may include an adhesive member located between the electronic panel 200 and the window member 100, or a chassis covering a portion of the window member 100.

According to an embodiment, the method of manufacturing the electronic device may include the process of forming the cushion layer 420 directly on the base layer 410, and thus an additional adhesive layer might not be interposed between the base layer 410 and the cushion layer 420. As a result, the stress caused by shape deformation of the base layer 410 may be stably absorbed through the cushion layer 420.

In addition, the method of manufacturing the electronic device according to embodiments of the invention may further include the process of treating the surface of the base layer 410, and thus the adhesive force between the base layer 410 and the cushion layer 420 may be improved. As a result, because the cushion layer 420 is stably coupled to the base layer 410, the coupled structure of the cushion layer 420 and the base layer 410 may be stably maintained throughout repeated deformation operations of the protective member, thereby improving the reliability of the electronic device EA.

According to some embodiments, the electronic device includes the protective member that is multi-layered and is realized as the integrated structure. Thus, it is possible to reduce the effects of, or prevent, the delamination phenomenon caused by repeated stresses, and the stresses applied to the layers of the protective member may be stably dispersed. As a result, the impact resistance of the electronic device may be improved and the reliability of the electronic device may be improved in a use process.

In addition, according to some embodiments, the base layer may include the material of which heat resistance is high, and thus it is possible to prevent the base layer from being damaged in the process of forming the cushion layer. As a result, the electronic device with the improved process reliability and the method of manufacturing the same can be provided.

While the invention has been described with reference to example embodiments, it will be apparent to those skilled in the art that various changes and modifications may be made without departing from the spirits and scopes of the invention. Therefore, it should be understood that the above embodiments are not limiting, but illustrative. Thus, the scopes of the invention are to be determined by the broadest permissible interpretation of the following claims and their equivalents, and shall not be restricted or limited by the foregoing description.

What is claimed is:

1. An electronic device comprising:
   an electronic panel configured to be folded along a folding axis extending in one direction and including an active area and a non-active area around the active area;
   a flexible window member on a top surface of the electronic panel;
   a protective member on a bottom surface of the electronic panel, the protective member comprising:
      a base layer; and
      a cushion layer having a porous structure, and being physically coupled directly to a bottom surface of the base layer that is further away from the electronic panel than a top surface of the base layer, a bottom surface of the cushion layer having convex portions such that the bottom surface of the cushion layer is uneven between nearest neighboring convex portions and is rough;
   a first adhesive member coupling the electronic panel to the protective member;
   a lower protective member between an insulating substrate and the first adhesive member and comprising a polymer material; and
   a second adhesive member contacting a bottom surface of the insulating substrate and a top surface of the lower protective member to couple the insulating substrate to the lower protective member,
   wherein the first adhesive member contacts a bottom surface of the lower protective member,
   wherein the active area of the electronic panel, a portion of the base layer overlapping the active area, and a portion of the cushion layer overlapping the active area are configured to be folded along the folding axis,
   wherein a surface property of the bottom surface of the base layer is different from that of the top surface of the base layer such that an adhesive force between the cushion layer and the bottom surface of the base layer is greater than an adhesive force between the cushion layer and the top surface of the base layer, and
   wherein the cushion layer is formed by directly applying a fluid foam member to the bottom surface of the base layer.

2. The electronic device of claim 1, wherein a roughness of the bottom surface of the base layer is greater than a roughness of the top surface of the base layer.

3. The electronic device of claim 1, wherein the bottom surface of the base layer is more hydrophilic than the top surface of the base layer.

4. The electronic device of claim 1, wherein the base layer includes crystalline polyethylene terephthalate (C-PET).

5. The electronic device of claim 1, wherein the first adhesive member comprises a pressure sensitive adhesive (PSA).

6. The electronic device of claim 1, wherein the cushion layer comprises synthetic resin foam.

7. The electronic device of claim 1, wherein the electronic panel comprises:
   the insulating substrate; and
   a driving element on the insulating substrate, configured to be activated by an external electrical signal applied thereto, and comprising at least one of a display element for displaying an image and a sensing element for sensing an external input applied to the electronic panel.

8. The electronic device of claim 1, wherein the electronic panel, the flexible window member, the first adhesive member, and the protective member are foldable along the folding axis.

9. The electronic device of claim 8, wherein the electronic device is operable in a first mode in which the electronic device is folded such that the flexible window member is closer to the folding axis than the protective member, and
wherein the electronic device is operable in a second mode in which the electronic device is folded such that the protective member is closer to the folding axis than the flexible window member.

10. The electronic device of claim 1, wherein the base layer comprises polyimide (PI), polyethylene naphthalate (PEN), or crystalline polyethylene terephthalate (C-PET).

11. The electronic device of claim 1, wherein the protective member further comprises a light-shielding layer contacting the top surface of the base layer, and
wherein the first adhesive member contacts a top surface of the light-shielding layer.

12. An electronic device comprising:
an electronic panel including an active area and a non-active area around the active area;
a window member on a top surface of the electronic panel;
a protective member on a bottom surface of the electronic panel, the protective member comprising:
a base layer; and
a cushion layer having a porous structure, and being physically coupled directly to a bottom surface of the base layer that is further away from the electronic panel than a top surface of the base layer, a bottom surface of the cushion layer having convex portions such that the bottom surface of the cushion layer is uneven between nearest neighboring convex portions and is rough;
a first adhesive member coupling the electronic panel to the protective member;
a lower protective member between an insulating substrate and the first adhesive member and comprising a polymer material; and
a second adhesive member contacting a bottom surface of the insulating substrate and a top surface of the lower protective member to couple the insulating substrate to the lower protective member,
wherein the first adhesive member contacts a bottom surface of the lower protective member,
wherein the active area of the electronic panel, a portion of the base layer overlapping the active area, and a portion of the cushion layer overlapping the active area are folded along a folding axis,
wherein a surface property of the bottom surface of the base layer is different from that of the top surface of the base layer such that an adhesive force between the cushion layer and the bottom surface of the base layer is greater than an adhesive force between the cushion layer and the top surface of the base layer, and
wherein the cushion layer is formed by directly applying a fluid foam member to the bottom surface of the base layer.

13. The electronic device of claim 12, wherein the cushion layer comprises synthetic resin foam.

14. The electronic device of claim 12, wherein the first adhesive member is in contact with the electronic panel, and
wherein the first adhesive member comprises at least one of a pressure sensitive adhesive (PSR), an optical clear adhesive (OCA), or an optical clear resin (OCR).

15. The electronic device of claim 12, wherein a roughness of the bottom surface of the base layer is greater than a roughness of the top surface of the base layer.

16. The electronic device of claim 12, wherein the bottom surface of the base layer is more hydrophilic than the top surface of the base layer.

* * * * *

UNITED STATES PATENT AND TRADEMARK OFFICE
CERTIFICATE OF CORRECTION

PATENT NO. : 12,052,833 B2
APPLICATION NO. : 15/923392
DATED : July 30, 2024
INVENTOR(S) : Sungjune Park et al.

It is certified that error appears in the above-identified patent and that said Letters Patent is hereby corrected as shown below:

In the Claims

In Column 20, Line 29, in Claim 14, delete "(PSR)," and insert -- (PSA), --.

Signed and Sealed this
Thirty-first Day of December, 2024

Derrick Brent
*Acting Director of the United States Patent and Trademark Office*